United States Patent
Vaughan et al.

(10) Patent No.: US 9,735,560 B2
(45) Date of Patent: Aug. 15, 2017

(54) LINK ASSEMBLY AND CABLE PROTECTOR

(71) Applicant: ULTRA ELECTRONICS LIMITED, Greenford Middlesex (GB)

(72) Inventors: Richard Vaughan, Gloucestershire (GB); Mark Salthouse, Bristol (GB); Christopher Biggadike, Gloucestershire (GB)

(73) Assignee: ULTRA ELECTRONICS LIMITED, Greenford Middlesex (GB)

( * ) Notice: Subject to any disclaimer, the term of this patent is extended or adjusted under 35 U.S.C. 154(b) by 0 days.

(21) Appl. No.: 15/024,076

(22) PCT Filed: Sep. 19, 2014

(86) PCT No.: PCT/GB2014/052862
§ 371 (c)(1),
(2) Date: Mar. 23, 2016

(87) PCT Pub. No.: WO2015/044648
PCT Pub. Date: Apr. 2, 2015

(65) Prior Publication Data
US 2016/0248239 A1    Aug. 25, 2016

(51) Int. Cl.
*H02G 11/02* (2006.01)
*H05K 5/02* (2006.01)

(52) U.S. Cl.
CPC .......... *H02G 11/02* (2013.01); *H05K 5/0239* (2013.01)

(58) Field of Classification Search
None
See application file for complete search history.

(56) References Cited

U.S. PATENT DOCUMENTS

| 4,499,341 A | 2/1985 | Boyd |
| 7,537,187 B2 * | 5/2009 | Park ...................... A47C 17/70 248/200 |
| 2011/0100679 A1 | 5/2011 | Biggadike |

FOREIGN PATENT DOCUMENTS

| FR | 2384700 A1 | 10/1978 |
| FR | 2964806 A1 | 3/2012 |

(Continued)

OTHER PUBLICATIONS

International Search Report and Written Opinion in International Application No. PCT/GB2014/052862 dated Mar. 25, 2015.
(Continued)

*Primary Examiner* — Dimary Lopez Cruz
(74) *Attorney, Agent, or Firm* — Hauptman Ham, LLP (57) ABSTRACT

A link assembly has a pair of mechanical links pivotally connected to rotate relative to one another about a pivot axis. A cable protector is provided as part of the link assembly. The cable protector has a cup with an end wall which defines a first end of a winding chamber, and an annular side wall which extends from the end wall and defines a side of the winding chamber. A lid defines a second end of the winding chamber opposite to the first end. The lid is coupled to the cup by a bearing so that the cup and lid can rotate with respect to each other. An opening is formed in the side wall of the cup and a slot is formed in the lid. The assembly is fitted with a cable having a length, a width, and a thickness, wherein the width of the cable is greater than its thickness. The cable has a first portion which extends along a first one of the links and passes into the side of the winding chamber through the opening in the side wall of the cup, a second portion which extends along a second one of the links and passes into the second end of the winding chamber through the slot in the lid, and a rolled portion in the winding chamber in which the cable is wound into a roll, the roll (Continued)

including an outer turn which leads to the first portion and an inner turn which is inside the outer turn and leads to the second portion.

12 Claims, 8 Drawing Sheets

(56) References Cited

FOREIGN PATENT DOCUMENTS

| | | |
|---|---|---|
| GB | 2473644 A | 3/2011 |
| JP | 2012054096 A | 3/2012 |
| WO | 2009130473 A1 | 10/2009 |

OTHER PUBLICATIONS

Search Report in Great Britain Application No. 1317306.7 dated Mar. 20, 2014.
EP Communication in EP Appln No. 14772213.6, dated Mar. 9, 2017.

* cited by examiner

LINK ASSEMBLY AND CABLE PROTECTOR

RELATED APPLICATIONS

The present application is a National Phase of International Application Number PCT/GB2014/052862, filed Sep. 19, 2014, which claims priority from Great Britain Application Number 1317306.7, filed Sep. 30, 2013.

FIELD OF THE INVENTION

This invention relates to routing of cables, and especially a means for routing a cable between components that move relative to one another repeatedly when in operation and therefore pose a fatigue problem for the cable. The invention also relates to a cable protector suitable for protecting such a cable.

BACKGROUND OF THE INVENTION

In aerospace applications it is often necessary to run electrical cables between components such as a wing structure and a flap that move relative to one another and cause the cable to flex. It is therefore necessary to design the cable run to protect against unacceptable damage over the lifetime of the cable.

WO2009/130473 describes a cable protector comprising a disc shaped member with a central aperture. An inner face of the cable protector is dished to accommodate the adjacent end of a helically wound section of cable. An arm extends tangentially from an outer edge of the disc shaped member, the arm comprising an end wall and a pair of side walls which together define a channel which is adapted to receive and key with a length of cable extending from the wound section of cable when in use. A tag extends from an outer edge of the disc shaped member.

SUMMARY OF THE INVENTION

According to a first aspect of the invention, there is provided a cable protector comprising: a cup with an end wall which defines a first end of a winding chamber, and an annular side wall which extends from the end wall and defines a side of the winding chamber; a lid which defines a second end of the winding chamber opposite to the first end, wherein the lid is coupled to the cup by a bearing so that the cup and lid can rotate with respect to each other; an opening in the side wall of the cup through which a first portion of a cable can pass into the side of the winding chamber; and a slot in the lid through which a second portion of the cable can pass into the second end of the winding chamber.

A second aspect of the invention provides a kit of parts for forming a cable protector according to the first aspect. The kit of parts comprises: a cup with an end wall which defines a first end of a winding chamber, and an annular side wall which extends from the end wall and defines a side of the winding chamber. A lid is provided which can be fitted to define a second end of the winding chamber opposite to the first end. The end wall and the lid have respective first and second hubs which are configured to form a bearing so that the cup and lid can rotate with respect to each other after the lid has been fitted. An opening is formed in the side wall of the cup through which a first portion of a cable can pass into the side of the winding chamber. A slot is formed in the lid through which a second portion of the cable can pass into the second end of the winding chamber after the lid has been fitted.

A third aspect of the invention provides a link assembly comprising: a pair of mechanical links pivotally connected to rotate relative to one another about a pivot axis; and a cable protector according to the first aspect. A cable is provided having a length L, a width W, and a thickness T, wherein the width (W) of the cable is greater than its thickness (T)—that is, L>W>T. The cable comprises a first portion which extends along a first one of the links and passes into the side of the winding chamber through the opening in the side wall of the cup, a second portion which extends along a second one of the links and passes into the second end of the winding chamber through the slot in the lid, and a rolled portion in the winding chamber in which the cable is wound into a roll. The roll includes an outer turn which leads to the first portion and an inner turn which is inside the outer turn and leads to the second portion.

The cable has a flat or strip-form sectional profile (the width of the cable being greater than its thickness) rather than a circular sectional profile as in WO2009/130473. This enables the side-to-side width of the winding chamber to be reduced compared with the equivalent winding chamber in WO2009/130473. The width of the cable is typically more than 10 times its thickness. The width of the slot in the lid is typically more than 5 times its thickness, to fit such a strip-form cable or stack of cables.

The inner and outer turns of the roll have outer edges which may form helical spirals with a small pitch. However more preferably they form planar spirals lying in a pair of parallel planes. Forming the cable into such a planar roll (rather than a helix as in WO2009/130473) enables the end-to-end depth of the winding chamber to be reduced compared with the equivalent winding chamber in WO2009/130473.

The opening in the side wall of the cup may be a square or circle, but more typically it is a slot, preferably with a width more than 1.5 times its thickness.

The end wall and the lid may have respective first and second hubs which contact each other to form the bearing. Typically the first and second hubs have respective first and second bores which together provide a channel (which is preferably circular in cross-section) passing through the cable protector. The end wall and the lid may have respective first and second apertures (which are preferably circular) which provide opposite ends of the channel. The pair of mechanical links may be pivotally connected to pivot relative to one another about the pivot axis by a pivot pin which passes through the channel.

The cup may have a cable guide which defines a cable channel extending tangentially away from the opening in the side wall of the cup and away from the winding chamber. The first portion of the cable passes into winding chamber through the cable channel.

The cup and/or lid may further comprise a respective keying feature which is adapted to key with a mechanical link, so that when the mechanical links rotate relative to one another about the pivot axis the cup and lid also rotate relative to one another about the pivot axis. In a preferred embodiment the cup and/or lid keying feature comprises a tag which extends from the annular side wall. For example the tag may comprise a pair of arms and a recess between the arms.

Preferably the side of the winding chamber is substantially circular in cross-section.

The first portion of the cable may be secured to the cup (for instance by being secured to the cable guide) and the second portion of the cable may be secured to the lid (for instance by being secured to the hub of the lid). The cable portions may be secured by a securing member such as a fastener or clamp, or by an adhesive bond.

The cable may comprise a stack of cables, each individual cable in the stack having a length, a width, and a thickness. Preferably the width of each individual cable is greater than its thickness, the stack of cables includes an outer cable and an inner cable, and the outer cable has a greater length than the inner cable in the rolled portion of the cable.

Typically the cup and lid are each formed from a material with a lower coefficient of friction than the material forming the links.

The pair of mechanical links are pivotally connected to pivot relative to one another about the pivot axis with a range of motion which is typically greater than 90° and preferably greater than 120°.

Forming the links and the cable protector as separate pieces enables the links to be relatively simple to manufacture and assemble. Also it enables the cable protector to be formed from a low friction material and/or a low density material, relative to the material forming the links.

In the preferred embodiment only the cup has an annular side wall defining the side of the winding chamber. However in an alternative embodiment of the invention both the cup and the lid may have annular side walls so the cup and lid form respective opposed symmetrical halves of the cable protector.

Typically the cable is an electrical cable for transmitting power and/or data. In such a case the cable preferably has an electrical conductor with a flat or strip-form sectional profile—in other words with a length (maximum dimension L), a width (W), and a thickness (T), wherein the width (W) of the electrical conductor is greater than its thickness (T)—that is, L>W>T.

BRIEF DESCRIPTION OF THE DRAWINGS

The invention will now be described by way of example with reference to the accompanying drawings in which.

DETAILED DESCRIPTION OF EMBODIMENT(S)

Figure 1:
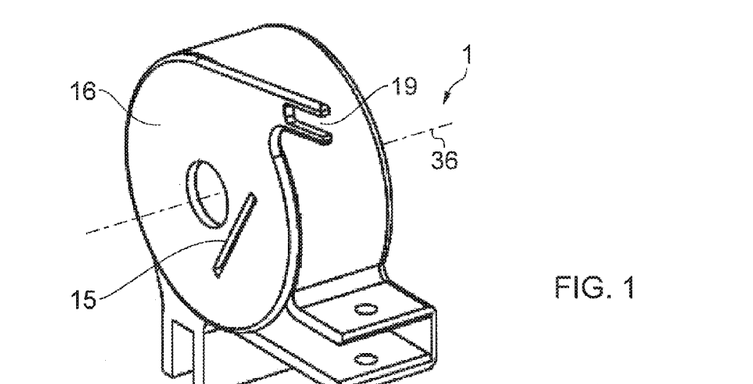
FIG. 1 is an isometric view of a cable protector.
Figure 2:
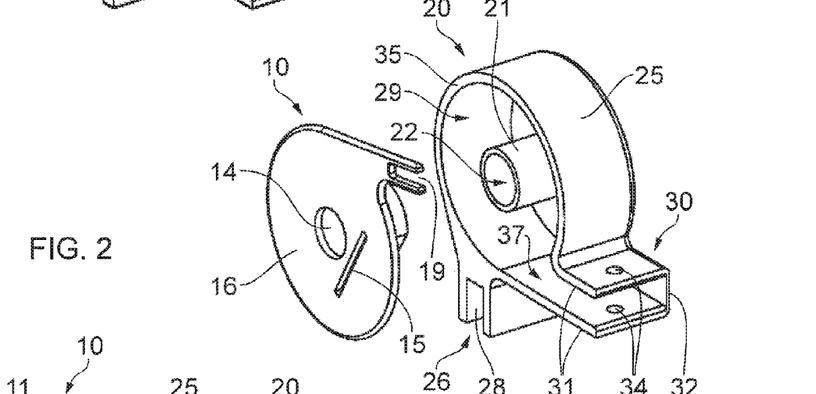
FIGS. 2 and 3 are isometric views of a kit of parts for assembling the cable protector of FIG. 1.
Figure 3:
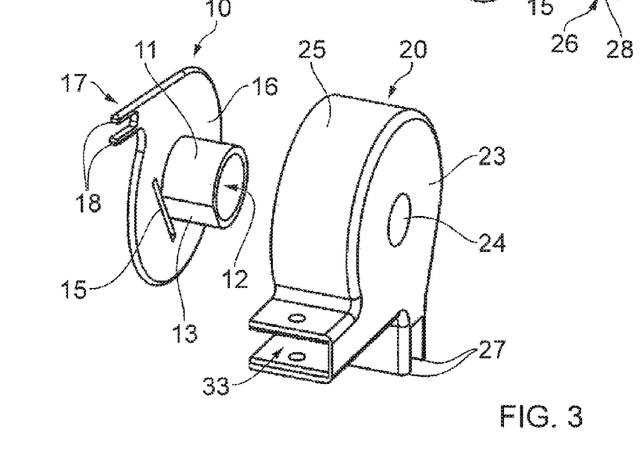

A cable protector 1 shown in FIG. 1 is assembled from a kit of two parts shown in FIGS. 2 and 3: a lid 10 and a cup 20. The cup has a planar end wall 23 which defines a first end of a winding chamber 29, and an annular side wall 25 which extends from the end wall 23 to an edge 35 and defines a side of the winding chamber. The lid 10 has a planar lid plate 16 which defines a second end of the winding chamber 29 opposite to the first end when it is fitted as shown in FIG. 1.

Figure 14:
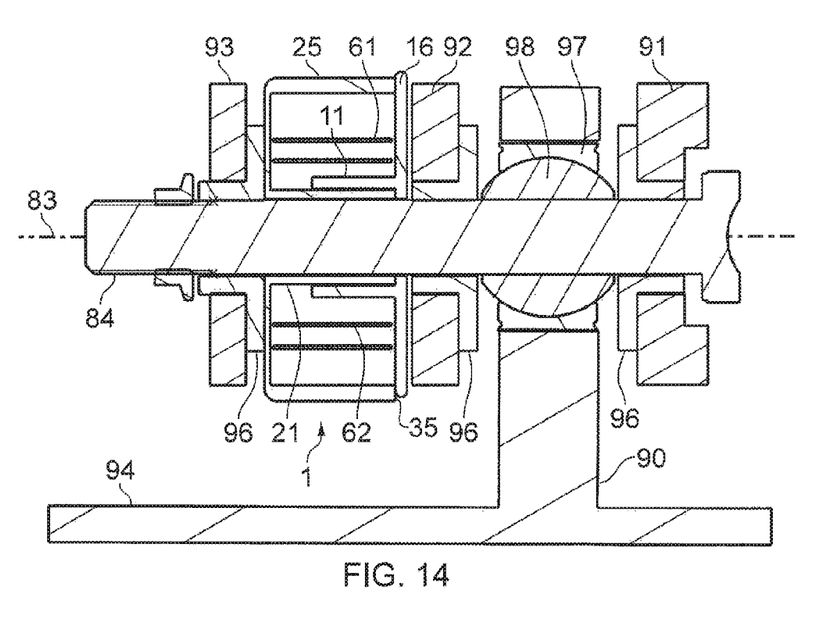
FIG. 14 is a sectional view of the joint.

The cup and lid have respective cylindrical hubs 21,11 with cylindrical bores 22,12. The cup and lid are assembled by inserting the first hub 21 into the bore 12 of the second hub until the first hub 21 and the edge 35 of the side wall 25 both contact the lid plate 16 as shown in FIG. 14. The two contacting cylindrical surfaces of the hubs 21,11 form a bearing so that the cup and lid can rotate with respect to each other about an axis 36 shown in FIGS. 1 and 16.

The cup is formed with a cable guide 30 with a pair of parallel side walls 31 and a base 32. The cable guide defines a cable channel 33 extending tangentially away from a first slot 37 and away from the winding chamber 29. A second slot 15 is formed in the lid.

Figure 5:
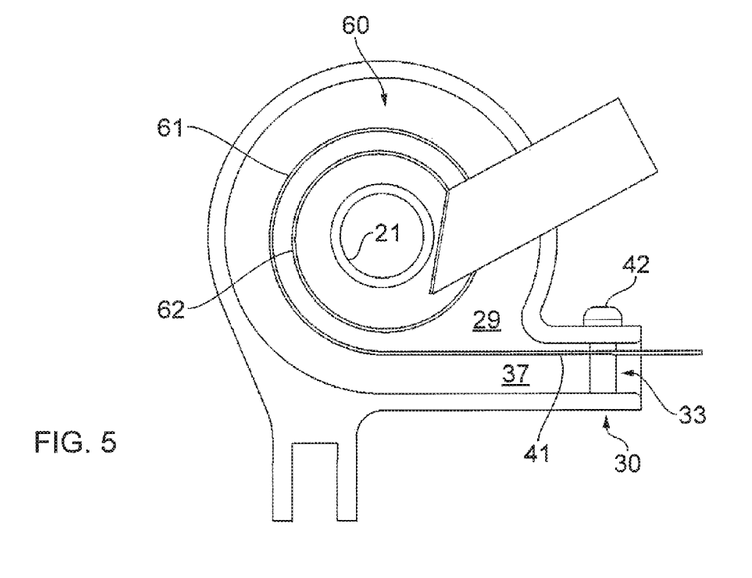
FIG. 5 is an end view of the cable protector with a cable installed and the lid removed.
Figure 6:
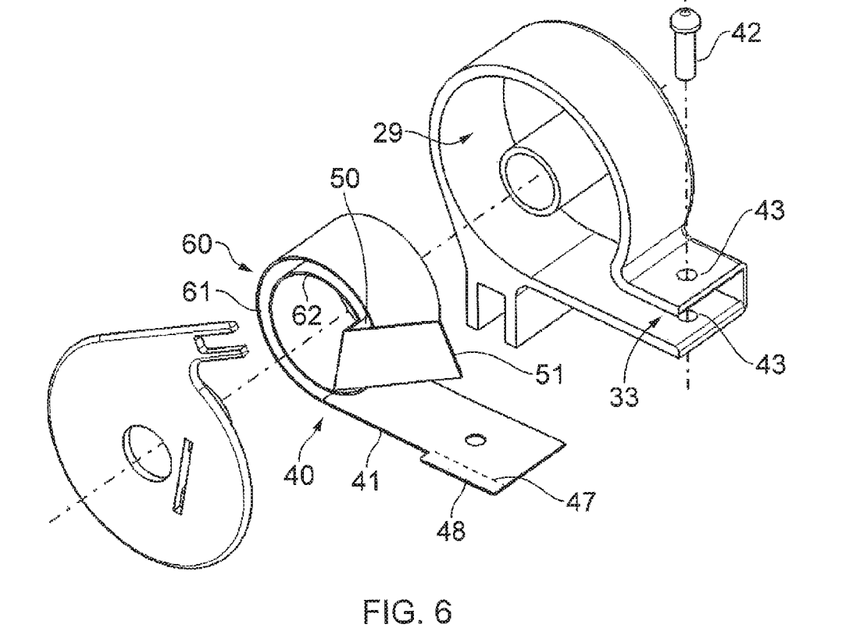
FIG. 6 is an exploded view of the cable protector and rolled cable.

A cable 40 shown in FIG. 6 is fitted to the cable protector. A first portion 41 of the cable passes tangentially into the side of the winding chamber 29 through the guide channel 33 and the first slot 37 as shown in FIG. 5. The first cable portion 41 is secured to the guide 30 by a fastener 42 passing through the cable portion 41 and through holes 43 (FIG. 6) in the walls of the guide 30. This fastener secures the cable portion 41 against length-wise and width-wise movement relative to the guide 30.

Figure 4:
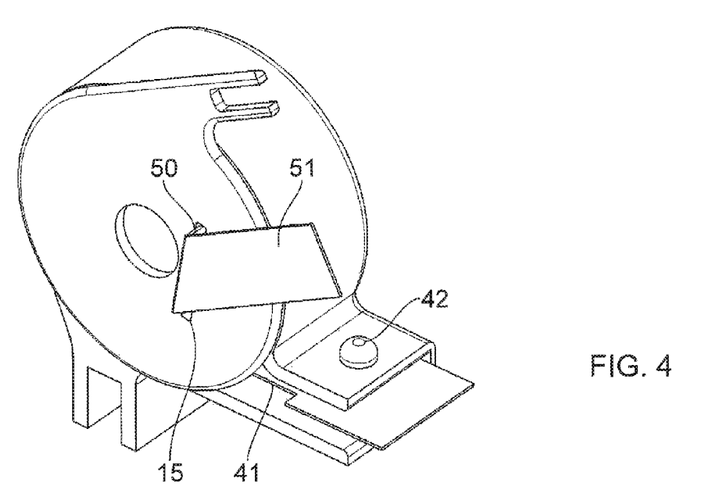
FIG. 4 is an isometric view of the cable protector with a cable installed.

A second portion 50 of the cable passes into the second end of the winding chamber through the slot 15 in the lid as shown in FIG. 4. As shown in FIG. 3 the outer surface of the hub 11 has a cylindrical portion and a flat portion 13. The second cable portion 50 is bonded to the flat portion 13 of the hub 11 by an adhesive, securing the second cable portion 50 against movement relative to the lid.

The cable also has a rolled portion in which it is wound into a roll 60 between the first and second portions 41,50. The roll 60 is fitted into the winding chamber 29 as shown in FIG. 5. It includes an outer turn 61 which leads to the first portion 41, and an inner turn 62 which is rolled up inside the outer turn and leads to the second portion 50 as shown in FIG. 6. The outer turn 61 is a full (360°) turn but the inner turn 62 is only a partial turn (in the winding state of FIG. 5 it winds around about 270°).

Figure 16:
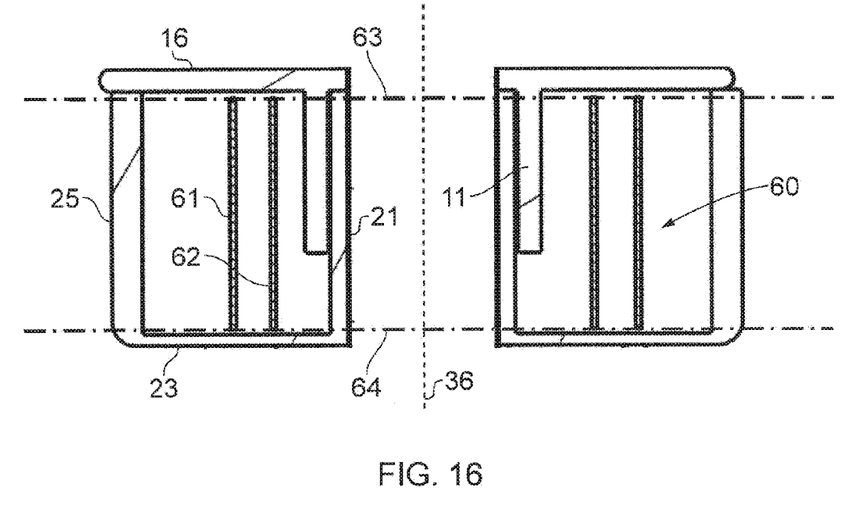
FIG. 16 is a sectional view of the cable protector and cable.

FIG. 16 is a sectional view of the cable protector containing the roll of cable. The cable is wound into a planar roll 60 rather than a helix, so that the outer edges of both turns 61,62 of the cable form planar spirals which lie in a pair of parallel planes 63,64 at right angles to the winding axis 36.

As can be seen in FIG. 6, the second portion 50 and the inner turn 62 of the roll form an L-shape so the second portion 50 extends out of the plane 63 of the roll in a direction parallel with the axis 36. The cable is then folded sideways out of the plane of the second portion 50 as shown in FIGS. 4 and 6, leading to a third portion 51 of the cable.

Figure 7:
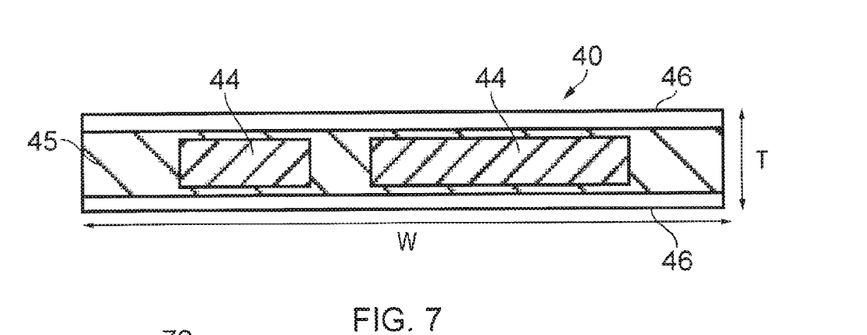
FIG. 7 is a sectional view of the cable.

FIG. 7 is a cross-section through the cable 40 transverse to its length showing its flat or strip-form rectangular sectional profile. The cable comprises a "flex circuit" cable with a pair of copper conductors 44 encased within a layer of adhesive 45 and a pair of polyimide insulator films 46. The cable has a length in and out of the plane of FIG. 7 (length L is its maximum dimension), a width W, and a thickness T which are not to scale in FIG. 7, where L>W>T. The width W of the cable is much greater than its thickness T—typically W is of the order of 10 mm and T is of the order of 0.25 mm (so the aspect ratio W/T is of the order of forty). Similarly the width of each conductor 44 is greater than its thickness, with an aspect ratio (W/T) of the order of 2-5.

Figure 8:
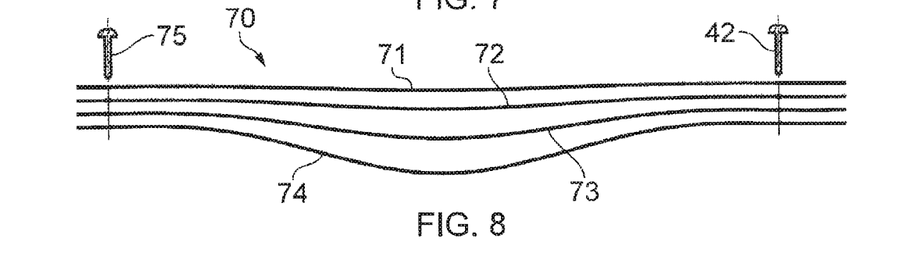
FIG. 8 is a side view of a stack of cables before they are wound into a roll.

FIGS. 4-7 show only a single cable, but optionally a stack of cables 70 as shown in FIG. 8 may be fitted into the cable protector rather than a single cable. Like the cable 40, each individual cable in the stack 70 has an aspect ratio W/T of the order of forty. The stack has four cables 71-74, the cable 71 being an inner cable on the inside of the roll and the cable 74 being an outer cable on the outside of the roll. The cables 71-74 have a progressively increasing length from the inner cable 71 to the outer cable 74 within the roll. The cables are secured to the cable protector on either side of the roll by the fastener 42, and by a second fastener 75 which secures the other end of the cable to the lid (rather than via a bonded connection with the hub 11 of the lid as in the embodiment of FIG. 4). The slot 15 in the lid of the cable protector has an aspect ratio (width/thickness) of the order of 7-10, similar to the stack 70 of cables so the stack 70 can fit snugly through it. The slot 37 and guide channel 33 in the cup have a similar width to the slot 15 in the lid, but a greater thickness in order to accommodate movement of the cable as it winds and unwinds. Therefore the aspect ratio (width/thickness) of the slot 37 and guide channel 33 in the cup is of the order of 2.

The cable 40 (and the stack 70) have a much reduced thickness (of the order of 1 mm) compared with that of the cable in WO2009/130473 (which is circular in section with a thickness of the order of 7 mm). Therefore even though the side-to-side width of the winding chamber 29 must be sufficiently large to accommodate the two turns 61, 62 of the roll 60, the cable can be rolled tightly so the side-to-side width of the winding chamber is reduced compared with the equivalent winding chamber in WO2009/130473.

Furthermore, because the cable is wound into a planar roll 60 (rather than a helix as in WO2009/130473) the end-to-end depth of the winding chamber (that is, the distance between its two opposed end walls 23,16) can be reduced compared with the equivalent winding chamber in WO2009/130473.

A link assembly 80 incorporating the cable protector 1 is shown in FIGS. 9-15. The assembly has a pair of mechanical links 81, 82 pivotally connected to rotate relative to one another about a pivot axis 83 of a pivot pin 84 shown in FIG. 14. The pivot axis 83 is co-incident with the axis 36 of the cable protector 1.

Figure 13:
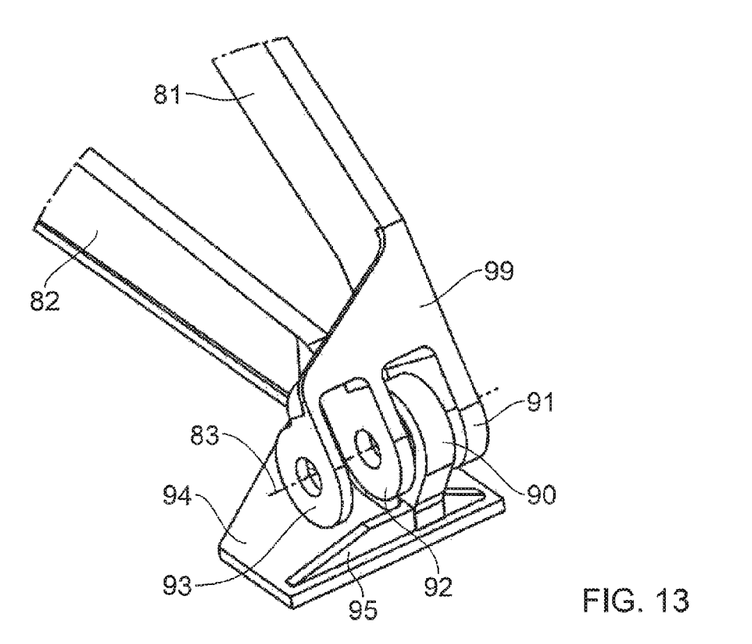
FIG. 13 shows the joint with various parts removed.

FIG. 13 shows the links 81,82 before the cable protector, pivot pin and cable have been fitted. The link has 81 three fingers 91-93 carried by a flange 99. At the joint the link 82 has an end part 90 which is fitted between first and second ones 91,92 of the fingers to form a clevis joint. FIG. 14 is a sectional view through the joint showing bushings 96 in the fingers and a bushing 97 and spherical bearing 98 in the end part 90 of the link 82. The cable protector 1 is fitted between the second and third fingers 92,93.

The end of the link 82 carries a plate 94 with a rib 95. Referring to FIGS. 2 and 3: the cup 20 of the cable protector is formed with a cup keying feature 26 comprising a tag with a pair of arms 27 which extends from the annular side wall 25. The rib 95 is received in a notch or recess 28 between the arms 27 so that the arms 27 key with the link 82. This keying ensures that when the links rotate relative to one another about the pivot axis 83, the cup 20 does not move relative to the link 82.

Figure 11:
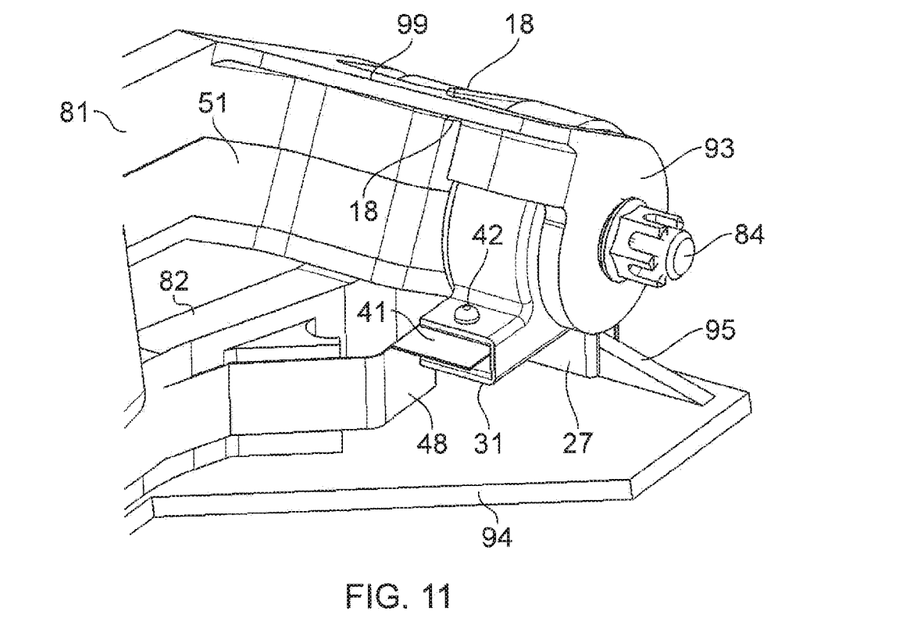
Figure 12:
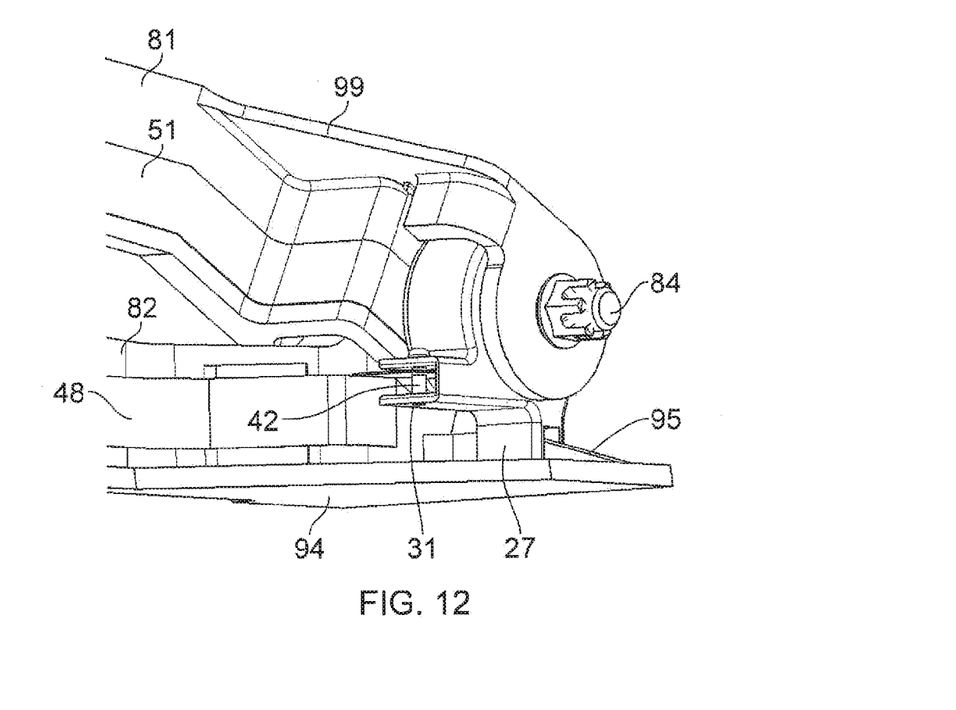

Similarly the lid 10 is formed with a lid keying feature 17 comprising a tag with a pair of arms 18 which extends from the edge of the lid. The flange 99 at the end of the link 81 is received in a notch or recess 19 between the arms 18 so that the arms 18 key with the link 81 as shown in FIG. 11. This keying ensures that when the links rotate relative to one another about the pivot axis 83, the lid 10 does not move relative to the link 81.

As shown in FIGS. 2 and 3, the hubs 21,11 have respective cylindrical bores 22,12 leading to circular apertures 24,14. These provide a channel passing through the cable protector which accommodates the pivot pin 84 as shown in FIG. 14.

Figure 9:
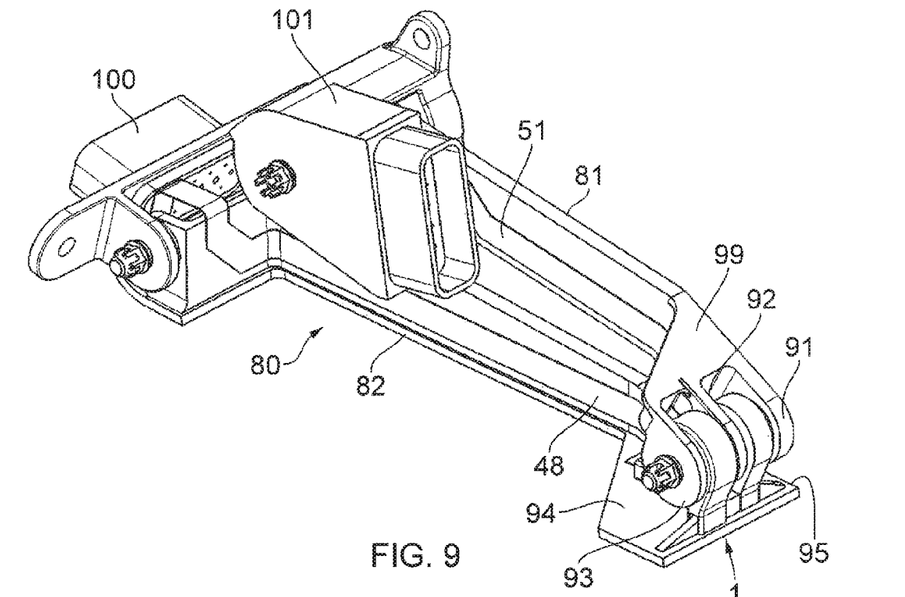
FIG. 9 shows a link assembly.
Figure 10:
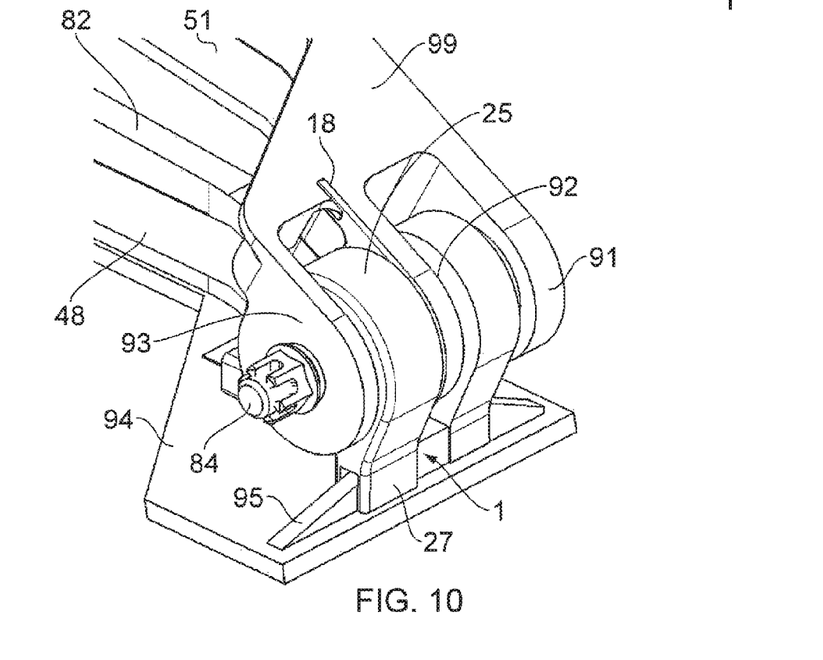
FIGS. 10-12 are enlarged views of the joint between the pair of links from different viewing angles.

FIG. 11 shows the first portion 41 of the cable leading tangentially into the cable protector. The cable is bent out of the plane of the portion 41 at a fold line 47 shown in FIG. 6, leading to a cable portion 48 only part of which is shown in FIG. 6. The cable portion 48 runs along the link 82, to which it is secured by bonding or by fasteners (not shown) such as cable ties. The cable portion 48 leads to a connector 100 at the other end of the link 82 as shown in FIG. 9. Similarly the cable portion 51 runs along the link 81, to which it is secured by bonding or by fasteners (not shown) such as cable ties. The cable portion 51 leads to a connector 101 at the other end of the link 81 as shown in FIG. 9.

The links 81,82 might be provided between the wing structure and the flap of an aircraft. The electrical cable 40 may service electrical signals or a power supply forming part of a warning system, for example, a system monitoring leading edge failures. Alternatively the links may couple different parts on a landing gear joint, or any other joint with regular flexing and a large range of motion.

In operation, as the links 81,82 pivot relative to one another, the respective lengths 51,48 of the cable and the parts 10,20 of the cable protector keyed to them, rotate relative to one another. As a result, the rolled cable section is either wound slightly as the links pivot together, or is unwound slightly, as the links pivot apart without unduly stressing the cable. FIGS. 9-12 show the links 81,82 in a closed position, but they can be pivoted to an open position with a range of motion of the order of 150°.

Each part 10,20 of the cable protector is formed from a bearing material such as Polyoxymethylene (sold under the trade name Delrin (R)) or Nylon. Such materials have a lower density and coefficient of friction than the structural material (such as aluminium) forming the links 81,82. FIG. 14 shows the contact between the first and second hubs 21,11, and between the side wall 25 and hub 21 of the cup and the lid plate 16. The low friction bearing material ensures that this contact between the cup and lid provides little friction opposing the relative motion between them. The low friction bearing material also enables the cable to slide against the cable protector and the hub 11 to slide against the pivot pin 84 with relatively friction.

Figure 15:
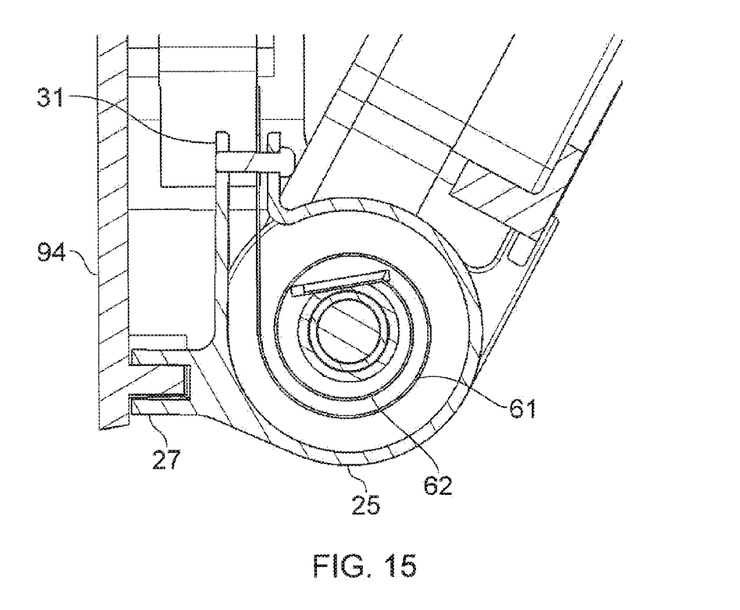
FIG. 15 is another sectional view of the joint.

Small gaps are shown in FIG. 16 between the opposed ends of the winding chamber and the two ends 63,64 of the rolled portion of the cable. However these gaps are sufficiently small that the cable may be engaged (and hence constrained) by the cable protector under certain operating conditions—for instance when the roll has drifted along the pivot axis due to vibration of the links. Similarly a gap is shown in FIGS. 14 and 15 between the outer turn 61 of the roll and the side wall 25 of the winding chamber, and this gap may also close under certain operating conditions.

Figure 17:
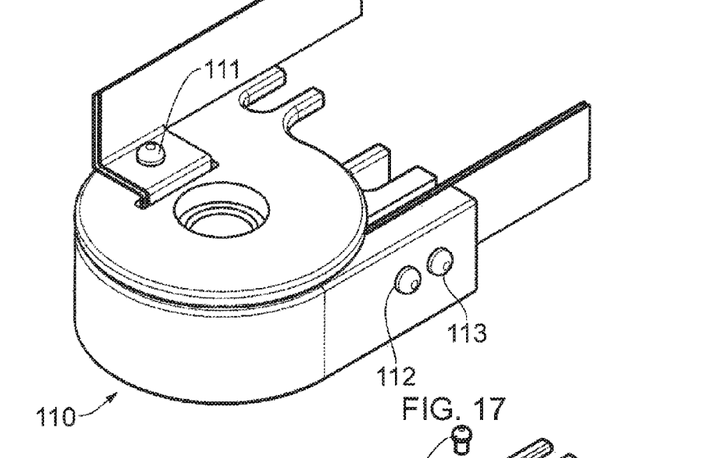
FIG. 17 is an isometric view of a cable protector according to another embodiment of the invention with a cable installed.
Figure 18:
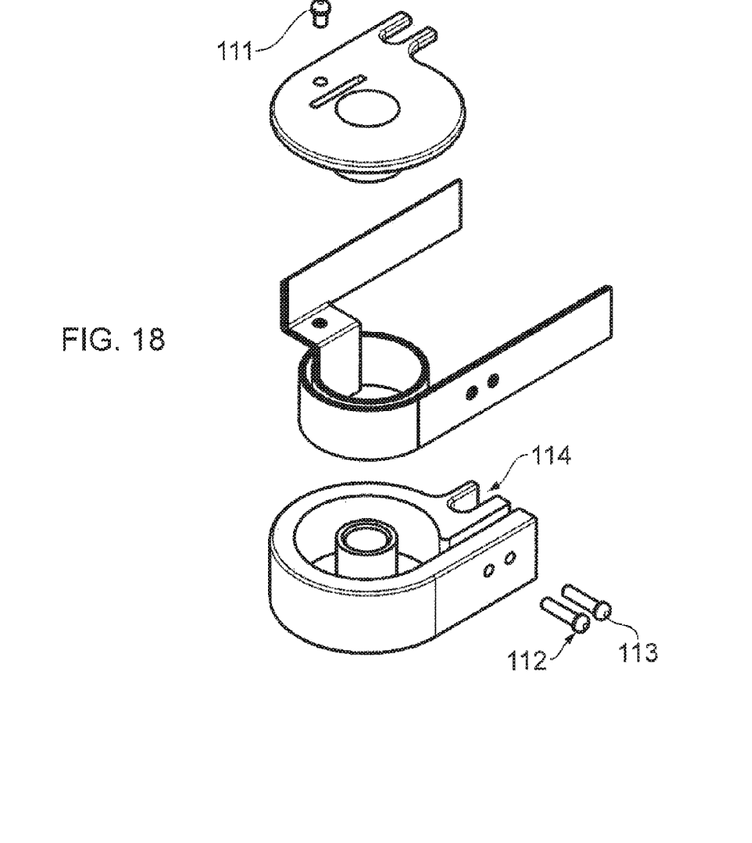
FIG. 18 is an isometric view of a kit of parts forming the assembly of FIG. 17.

FIGS. 17 and 18 show a cable protector 110 according to a second embodiment of the invention. It is similar in many respects to the cable protector 1 so only the differences will be described. Firstly, the cable is secured to the lid by a fastener 111 rather than by being bonded to the hub of the lid. Secondly, the other end of the cable is secured to the cup by a pair of fasteners 112, 113 rather than only a single fastener 42 as in the embodiment of FIG. 4. Thirdly, the keying feature 114 of the cup is positioned next to the cable guide.

Although the invention has been described above with reference to one or more preferred embodiments, it will be appreciated that various changes or modifications may be made without departing from the scope of the invention as defined in the appended claims.

The invention claimed is:

1. A link assembly comprising:
 a. a pair of mechanical links pivotally connected to rotate relative to one another about a pivot axis;
 b. a cup with an end wall which defines a first end of a winding chamber, and an annular side wall which extends from the end wall and defines a side of the winding chamber;
 c. a lid which defines a second end of the winding chamber opposite to the first end, wherein the lid is coupled to the cup by a bearing so that the cup and lid can rotate with respect to each other;
 d. an opening in the side wall of the cup;
 e. a slot in the lid; and
 f. a cable having a length, a width, and a thickness, wherein the width of the cable is greater than its thickness, and the cable comprises:
   i. a first portion which extends along a first one of the links and passes into the side of the winding chamber through the opening in the side wall of the cup,
   ii. a second portion which extends along a second one of the links and passes into the second end of the winding chamber through the slot in the lid, and
   iii. a rolled portion in the winding chamber in which the cable is wound into a roll, the roll including an outer turn which leads to the first portion and an inner turn which is inside the outer turn and leads to the second portion.

2. The assembly of claim 1 wherein the cup further comprises a cup keying feature which keys with a first one of the mechanical links; and the lid further comprises a lid keying feature which keys with a second one of the mechanical links so that when the mechanical links rotate relative to one another about the pivot axis, the cup and lid also rotate relative to one another about the pivot axis.

3. The assembly of claim 2 wherein the end wall and the lid have respective first and second hubs which contact each other to form the bearing; and the second portion of the cable is secured to the second hub.

4. The assembly of claim 1 wherein the first portion of the cable is secured to the cup and the second portion of the cable is secured to the lid.

5. The assembly of claim 1 wherein the cup further comprises a cable guide which defines a cable channel extending tangentially away from the opening in the side wall of the cup and away from the winding chamber; and the first portion of the cable passes into winding chamber through the cable channel.

6. The assembly of claim 5 wherein the first portion of the cable is secured to the cable guide.

7. The assembly of claim 1 wherein the cable comprises a stack of cables, each individual cable in the stack having a length, a width, and a thickness; the width of each individual cable is greater than its thickness; the stack of cables includes an outer cable and an inner cable; and the outer cable has a greater length than the inner cable in the rolled portion of the cable.

8. The assembly of claim 1 wherein the cable has a width and a thickness, and the width of the cable (or each individual cable in the stack) is more than 10 times its thickness.

9. The assembly of claim 1 wherein the cup and lid are each formed from a material with a lower coefficient of friction than the material forming the links.

10. The assembly of any of claim 1 wherein the pair of mechanical links are pivotally connected to pivot relative to one another about the pivot axis with a range of motion which is greater than 90° and preferably greater than 120°.

11. The assembly of claim 1 wherein the end wall and the lid have respective first and second apertures which provide opposite ends of a channel passing through the cable protector; and the pair of mechanical links are pivotally connected to pivot relative to one another about the pivot axis by a pivot pin which passes through the channel.

12. The assembly of claim 1 wherein the inner and outer turns of the roll have outer edges which form planar spirals lying in a pair of parallel planes.

\* \* \* \* \*

UNITED STATES PATENT AND TRADEMARK OFFICE
CERTIFICATE OF CORRECTION

PATENT NO. : 9,735,560 B2
APPLICATION NO. : 15/024076
DATED : August 15, 2017
INVENTOR(S) : Richard Vaughan et al.

Page 1 of 1

It is certified that error appears in the above-identified patent and that said Letters Patent is hereby corrected as shown below:

On the Title Page

The Foreign Application Priority Data should read as follows:
(30)   Foreign Application Priority Data
Sep. 30, 2013   (GB) ......................................1317306.7

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*